United States Patent
Bertram et al.

(10) Patent No.: US 7,978,001 B2
(45) Date of Patent: Jul. 12, 2011

(54) MICROPROCESSOR WITH SELECTIVE SUBSTRATE BIASING FOR CLOCK-GATED FUNCTIONAL BLOCKS

(75) Inventors: Raymond A. Bertram, Austin, TX (US); Mark J. Brazell, Cedar Park, TX (US); Vanessa S. Canac, Austin, TX (US); Darius D. Gaskins, Austin, TX (US); James R. Lundberg, Austin, TX (US); Matthew Russell Nixon, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 211 days.

(21) Appl. No.: 12/237,483

(22) Filed: Sep. 25, 2008

(65) Prior Publication Data
US 2010/0073074 A1 Mar. 25, 2010

(51) Int. Cl.
*H03K 17/687* (2006.01)
*G05F 3/08* (2006.01)

(52) U.S. Cl. .................. 327/534; 327/543; 327/544

(58) Field of Classification Search .................. None
See application file for complete search history.

(56) References Cited

U.S. PATENT DOCUMENTS

| | | | |
|---|---|---|---|
| 5,557,231 A | 9/1996 | Yamaguchi et al. | |
| 6,034,563 A * | 3/2000 | Mashiko | 327/544 |
| 6,218,895 B1 * | 4/2001 | De et al. | 327/566 |
| 6,232,793 B1 * | 5/2001 | Arimoto et al. | 326/34 |
| 6,630,857 B2 * | 10/2003 | Mizuno et al. | 327/534 |
| 6,635,934 B2 * | 10/2003 | Hidaka | 257/369 |
| 6,696,865 B2 | 2/2004 | Horiguchi et al. | |
| 6,744,301 B1 | 6/2004 | Tschanz et al. | |
| 6,967,522 B2 | 11/2005 | Chandrakasan et al. | |
| 7,161,408 B2 | 1/2007 | Mizuno et al. | |
| 7,164,307 B2 | 1/2007 | Tschanz et al. | |
| 7,355,437 B2 * | 4/2008 | Perisetty | 326/14 |
| 7,397,282 B2 * | 7/2008 | Mizuno et al. | 326/81 |
| 7,605,601 B2 * | 10/2009 | Tachibana et al. | 326/21 |
| 2008/0174359 A1 * | 7/2008 | Osada et al. | 327/534 |

\* cited by examiner

*Primary Examiner* — Lincoln Donovan
*Assistant Examiner* — Terry L Englund
(74) *Attorney, Agent, or Firm* — Gary R. Stanford; James W. Huffman

(57) ABSTRACT

A microprocessor according to one embodiment includes a supply node providing a core voltage, a functional block, a charge node, select logic, and substrate bias logic. The functional block has multiple power modes and includes one or more semiconductor devices and a substrate bias rail routed within the functional block and coupled to a substrate connection of at least one semiconductor device. The select logic couples the substrate bias rail to the charge node when the functional block is in a low power mode and clamps the substrate bias rail to the supply node when the functional block is in a full power mode. The substrate bias logic charges the charge node to a bias voltage at an offset voltage relative to the core voltage when the functional block is in the low power mode. Semiconductor devices may be provided to clamp or otherwise couple the bias rail.

16 Claims, 5 Drawing Sheets

US 7,978,001 B2

MICROPROCESSOR WITH SELECTIVE SUBSTRATE BIASING FOR CLOCK-GATED FUNCTIONAL BLOCKS

CROSS-REFERENCE TO RELATED APPLICATIONS

This application is related to the following co-pending U.S. patent applications, each of which has a common assignee and common inventors.

| SER. NO. | FILING DATE | TITLE |
| --- | --- | --- |
| 12/237,463 (CNTR.2419) | Sep. 25, 2008 | MICROPROCESSOR WITH SUBSTRATE BIAS CLAMPS |

BACKGROUND OF THE INVENTION

1. Field of the Invention

The present invention relates to substrate biasing provided on a microprocessor die to reduce sub-threshold leakage, and more particularly to an apparatus and method for selective substrate biasing for a functional block on the microprocessor to reduce power consumption and to minimize noise on device substrates within the functional block.

2. Description of the Related Art

Complementary Metal-Oxide Semiconductor (CMOS) circuitry dissipates less power and is more dense than other types of integrated circuit (IC) technologies so that CMOS technology has become the dominant style of digital circuit design for integrated circuits. CMOS circuits use a combination of N channel (NMOS) and P channel (PMOS) devices each having a threshold gate-to-source voltage based on design, scale, materials and process. As IC design and fabrication techniques continue to evolve, operating voltages and device size have each scaled downward. The 65 nanometer (65 nm) process is an advanced lithographic process used for volume CMOS semiconductor fabrication and is particularly advantageous for Very Large Scale Integrated (VLSI) circuits, such as microprocessors and the like. As device size and voltage levels have decreased, the channel lengths and oxide thicknesses of each device have also decreased. Manufacturers have also switched to gate materials causing lower voltage thresholds which have further led to increased sub-threshold leakage current. Sub-threshold leakage current is the current that flows between the drain and source when the gate-to-source voltage is below the threshold voltage of the CMOS device. In many conventional circuits the substrate interface, also referred to as the well or bulk tie, of each CMOS device is coupled to a corresponding one of the power rails (e.g., PMOS bulk tied to VDD and NMOS bulk tied to VSS). In such conventional configurations the sub-threshold leakage current may account for nearly 30% or more of total power consumption in the dynamic environment (e.g., during normal operation).

It is often desired to operate an IC in a low power mode (e.g., sleep or hibernation mode) and reduce power consumption as much as possible. A bias generator or charge pump is used to bias device substrates to a voltage level other than the supply voltages during low power mode. The bias generator may be provided on the chip die or provided off-chip. In either case, the bias generator raises the bulk tie of PMOS devices above VDD and lowers the voltage of the bulk tie of NMOS devices below VSS. Such substrate biasing significantly reduces the sub-threshold leakage current during low power mode thereby conserving a substantial amount of power. In a large scale device, however, such as a microprocessor or the like, it is not always desired to place the entire device in the low power state. It is desired to reduce sub-threshold leakage current in at least a portion of a microprocessor when that portion is not in use.

SUMMARY OF THE INVENTION

A microprocessor according to one embodiment includes a first supply node providing a first core voltage, a functional block, a first charge node, first select logic, and substrate bias logic. The functional block has multiple power modes and includes one or more semiconductor devices and a first substrate bias rail routed within the functional block and coupled to a substrate connection of at least one semiconductor device. The first select logic couples the first substrate bias rail to the first charge node when the functional block is in a low power mode and clamps the first substrate bias rail to the first supply node when the functional block is in a full power mode. The substrate bias logic charges the first charge node to a first bias voltage at a first offset voltage relative to the first core voltage when the functional block is in the low power mode.

The first select logic may include a semiconductor device coupled between the first substrate bias rail and the first supply node or between the first substrate bias rail and the first charge node selectively activated by the first select logic. The first select logic may be controlled by control logic of the substrate bias logic. The first select logic may include level shift logic for controlling the semiconductor device(s) to ensure each is turned off. The functional block may include additional clamp devices for clamping the first substrate bias rail. Level shift logic and buffer logic may be included to control the clamp devices. The functional block may include a second substrate bias rail, where the microprocessor includes a second charge node and second select logic. The substrate bias logic may include a bias generator which charges the first charge node at a positive offset voltage added to the first core voltage in the low power mode and which charges the second charge node at a negative offset voltage added to a second core voltage in the low power mode. The charge node(s) and the select logic may be provided external to or within the functional block.

An integrated circuit according to an embodiment of the present invention includes a substrate, a functional block, first and second bias rails, supply conductors providing positive and reference core voltages, and a substrate bias circuit.

A method of selectively biasing substrates of semiconductor devices of a functional block of a microprocessor chip which develops a first core voltage and which includes a substrate bias rail routed within the functional block used to reduce sub-threshold leakage of at least one of the semiconductor devices according to one embodiment includes clamping the substrate bias rail to the first core voltage when the functional block is in a first power state, and unclamping the substrate bias rail and driving the substrate bias rail to a substrate bias voltage when the functional block is in a second power state.

The method may include activating a clamp device coupled between the substrate bias rail and the first core voltage. The method may include driving the gate of a semiconductor device to one of a second core voltage and the substrate bias voltage. The method may include level shifting an enable signal to switch between the substrate bias voltage and the second core voltage, and providing the level-shifted enable signal to the gate of the semiconductor device. The method may include charging a charge node to an offset voltage relative to the first core voltage, and coupling the substrate bias rail to the charge node.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present inventors have determined the need for reducing sub-threshold current leakage in a functional block of a microprocessor when the functional block is shut down or otherwise placed in a low-power mode. They have therefore developed a microprocessor with selective substrate biasing to reduce sub-threshold leakage in a functional block, as will be further described below with respect to FIGS. 1-6.

Figure 1:
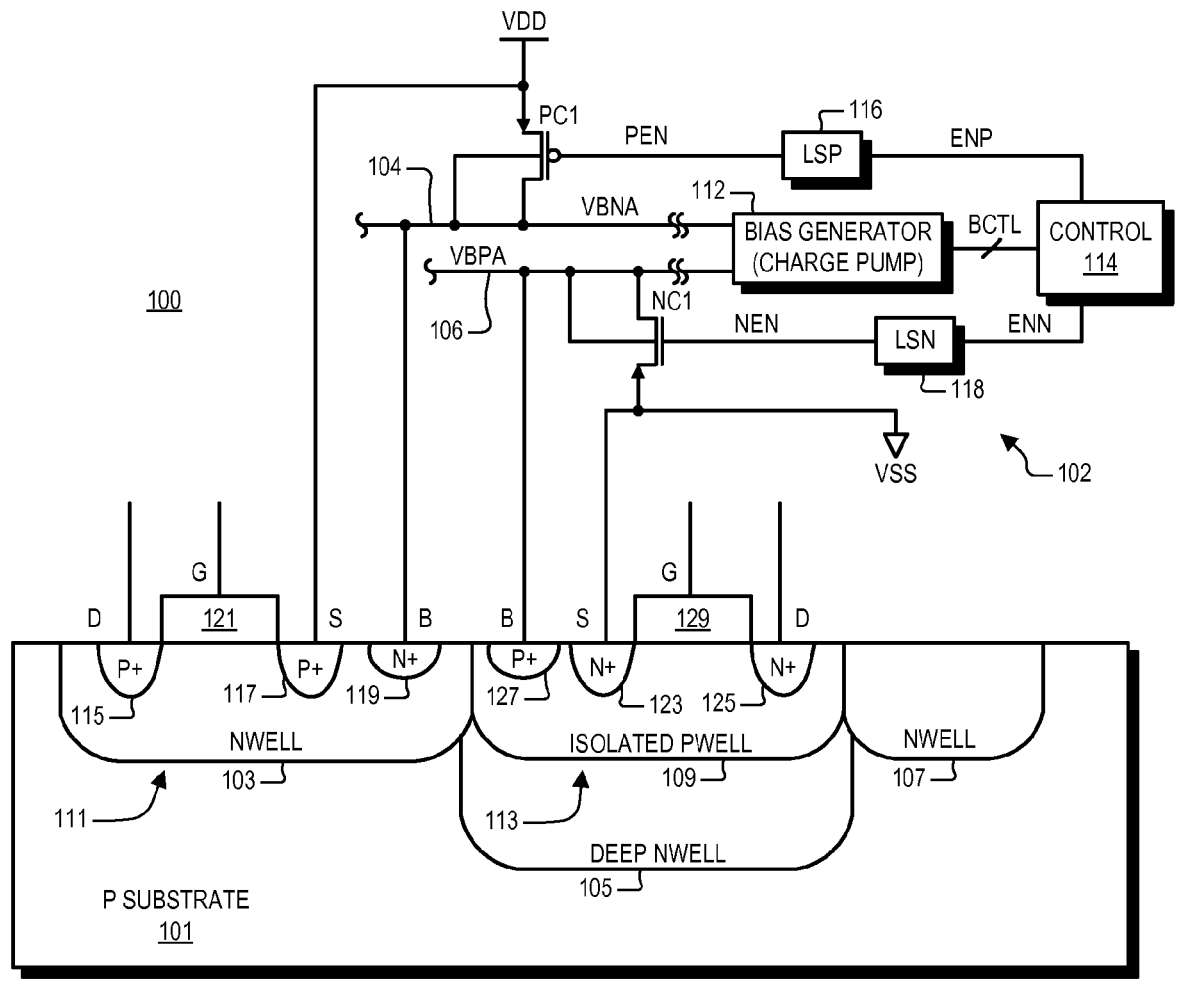
FIG. 1 is a figurative diagram of an integrated circuit (IC) including exemplary CMOS devices integrated onto a P substrate, and further showing a schematic and block diagram of a substrate bias circuit integrated onto the IC according to an exemplary embodiment.

FIG. 1 is a figurative diagram of an integrated circuit (IC) 100 including exemplary CMOS devices integrated onto a P substrate 101, and further showing a schematic and block diagram of a substrate bias circuit 102 integrated onto the IC 100 according to an exemplary embodiment. The particular device configuration shown is referred to as the "twin-well" process although other types of processes are contemplated, such as N-well, P-well, triple-well, etc. Several N-type well (NWELL) regions 103, 105 and 107 are formed within the bulk P-substrate 101 in which the NWELL region 105 is a deep NWELL region. An isolated P-type well (PWELL) region 109 is formed within the deep NWELL region 105. The first NWELL region 103 is used to fabricate a P-channel device 111 and the isolated PWELL region 109 is used to fabricate an N-channel device 113. The third NWELL region 107 may be used to implement another device as understood by those skilled in the art and is not further described herein. Although only two devices 111 and 113 are shown and described, it is understood that any number of additional devices may be implemented on the P substrate 101.

A pair of P-type diffusion regions (P+) 115 and 117 and an N-type diffusion region (N+) 119 are formed within the NWELL region 103 of the P-channel device 111. The P-channel device 111 further includes a gate insulator layer 121 formed on the NWELL region 103 overlapping the P-type diffusion regions 115 and 117. The P+ region 115 forms the drain terminal, denoted "D", the P+ region 117 forms the source terminal, denoted "S", and the gate insulator 121 forms the gate terminal, denoted "G", of the P-channel device 111. The gate and drain terminals of the P-channel device 111 are coupled to corresponding signals (not shown) on the IC 100 depending upon the particular function of the device. The source terminal of the P-channel device 111 is shown coupled to a core voltage VDD. The N+ region 119 forms a well or bulk connection, denoted "B", which is coupled to a substrate bias rail 104 providing a substrate bias voltage VBNA for P-channel devices. For the N-channel device 113, a pair of N-type diffusion regions (N+) 123 and 125 and a P-type diffusion region (P+) 127 are formed within the isolated PWELL region 109 and a gate insulator layer 129 is formed on the PWELL region 109 overlapping the N-type diffusion regions 123 and 125. The N+ region 125 forms the drain terminal D, the N+ region 123 forms the source terminal S, and the gate insulator 129 forms the gate terminal G. The gate and drain terminals of the N-channel device 113 are coupled to corresponding signals (not shown) on the IC 100 depending upon the particular function of the device. The source terminal of the N-channel device 113 is shown coupled to a core reference voltage VSS, which is a signal ground in the illustrated embodiment. The P+ region 127 forms a well or bulk connection B which is shown coupled to a substrate bias rail 106 providing a substrate bias voltage VBPA for N-channel devices.

It is understood that the core voltages VSS and VDD are provided throughout an IC or chip using conductors or conductive traces or the like, such as conductive vias, conductive nodes, conductive rails, conductive buses or bus signals and the like as known to those skilled in the art. The substrate bias voltage rails 104 and 106 are also implemented as conductors or conductive traces or the like.

The substrate bias circuit 102 includes a bias generator 112 having outputs developing the substrate bias voltages VBNA and VBPA on the substrate bias rails 104 and 106, respectively. In the illustrated embodiment, the bias generator 112 is implemented as a charge pump integrated on the IC 100 although other types of voltage generators are contemplated. The bias generator 112 is controlled via bias control signals BCTL provided by a control circuit 114. The control circuit 114 has an output providing a voltage clamp enable signal ENP to the input of a P-type level shifter (LSP) circuit 116, which has an output providing a corresponding clamp enable signal PEN to the gate of a P-channel device PC1. PC1 has its source coupled to VDD and its drain and bulk coupled to the substrate bias rail 104. The control circuit 114 has another output providing another voltage clamp enable signal ENN to the input of an N-type level shifter (LSN) circuit 118, which has an output providing a corresponding clamp enable signal NEN to the gate of an N-channel device NC1. NC1 has its source coupled to VSS and its drain and bulk coupled to the substrate bias rail 106. The control circuit 114 switches the ENP and ENN control signals between a normal voltage range of VSS and VDD for the IC 100. The LSP circuit 116 shifts the voltage range of the PEN signal to operate between VSS and VBNA and the LSN circuit 118 shifts the voltage range of the NEN signal to operate between VBPA and VDD as further described below. In general, when the control circuit 114 asserts the ENP signal low, the LSP circuit 116 asserts the PEN signal low to turn PC1 on to clamp the substrate bias rail 104 to VDD. When the control circuit 114 asserts the ENP signal high, the LSP circuit 116 asserts the PEN signal high to turn PC1 off. Likewise, when the control circuit 114 asserts the ENN signal high, the LSN circuit 118 asserts the NEN signal high to turn NC1 on to clamp the substrate bias rail 106 to VSS. When the control circuit 114 asserts the ENN signal low, NC1 is turned off.

When it is desired to operate the IC 100 in the dynamic mode for normal operation, the control circuit 114 controls the bias generator 112 to drive the voltage of VBNA to the same voltage level of VDD and to drive the voltage of VBPA to the same voltage level of VSS. Thus, during normal dynamic mode operation, the bulk of the P-channel device 111 is driven to VDD and the bulk connection of the N-channel device 113 is driven to VSS. Also, the control circuit 114 asserts the ENP signal low (so that PEN also goes low) to turn PC1 on to clamp the substrate bias rail 104 to VDD and asserts the ENN signal high (so that NEN also goes high) to turn NA NC1 on to clamp the substrate bias rail 106 to VSS for normal dynamic mode operation. Although only one P-channel clamp device PC1 is shown for the substrate bias rail 104 and one N-channel clamp device NA NC1 is shown for the substrate bias rail 106, any number of clamp devices may be distributed along the length of each of the substrate bias rails 104 and 106.

The substrate bias rails 104 and 106 are routed to devices integrated on the P substrate 101 including the devices 111 and 113. It is desired that the VBNA and VBPA voltages be as consistent as possible along the substrate bias rails 104 and 106 particularly during normal operation. In general, the larger the size of the P substrate 101 and/or the greater the number of integrated devices, the longer the substrate bias rails 104 and 106. The substrate bias rails 104 and 106 are implemented with physical conductors having a corresponding impedance resulting in an increasing voltage drop along the length of each rail the further away from the bias generator 112. If either of the devices 111 and 113 is located relatively far from the bias generator 112, then the voltage levels of VBNA and VBPA may vary from the voltage levels of VDD and VSS, respectively, by a significant amount which may have a negative impact on operation and compromise performance. Furthermore, the substrate bias rails 104 and 106 tend to propagate noise caused by capacitive coupling and the like further impairing operation and degrading performance.

In one embodiment, the number and locations of the clamp devices are selected to clamp each substrate bias rail within a predetermined minimum voltage level of a corresponding one of the core voltages VDD and VSS during normal operation. In this manner, when the clamp devices are activated, the voltage of the substrate bias rail 104 is "clamped" to VDD within the predetermined minimum voltage level and the voltage of the substrate bias rail 106 is clamped to VSS within the predetermined minimum voltage level. Such clamping reduces noise caused by capacitive coupling and minimizes voltage variation along both of the substrate bias rails 104 and 106. In one embodiment, after the substrate bias rails 104 and 106 are clamped to the core voltages VDD and VSS, the bias generator 112 may be shut down or otherwise switched to low power mode if desired to further reduce noise and to conserve power.

When it is desired to operate the IC 100 in the low power mode, the control circuit 114 asserts ENP high and ENN low to turn off the clamp devices PC1 and NC1. It is noted that the IC 100 may have multiple operating states or modes, including one or more low power modes or states in which at least a portion of the area of the IC 100 is placed in a low power condition or otherwise turned off In the low power mode, the control circuit 114 also controls the bias generator 112 to drive the voltage of VBNA above VDD by a first substrate bias offset voltage and to drive the voltage of VBPA below VSS by a second substrate bias offset voltage. The first and second substrate bias offset voltages may be equivalent or they may be different voltages depending upon the particular configuration. In the low power mode, therefore, the bulk of the P-channel device 111 is pulled above VDD and the bulk of the N-channel device 113 is pulled below VSS to minimize sub-threshold leakage current in both devices.

As described further below, the LSP circuit 116 shifts the voltage of PEN to VBNA when ENP is asserted to VDD. In this manner, ENP switches between VSS and VDD whereas PEN switches between VSS and VBNA in which VBNA is driven above VDD during low power mode. The LSP circuit 116 ensures that the clamp device PC1 turns fully off in low power mode when VBNA is driven above the voltage of VDD by the bias generator 112. In particular, the control circuit 114 asserts ENP high to VDD to turn off PC1 while the bias generator 112 drives VBNA above VDD. If the ENP signal was provided directly to the gate of PC1, then the gate of PC1 would only be at VDD whereas its drain would be above VDD potentially allowing PC1 to remain at least partially on. Instead, the LSP circuit 116 drives PEN to the voltage level of VBNA so that the gate and drain of PC1 are both at the voltage level of VBNA which is above VDD ensuring that PC1 is turned fully off.

In a similar manner, the LSN circuit 118 shifts the voltage of NEN to VBPA when ENN is asserted to VSS. Thus, ENN switches between VSS and VDD whereas NEN switches between VBPA and VDD in which VBPA is driven below VSS during low power mode. The LSN circuit 118 ensures that the N-channel clamp device NC1 turns fully off in low power mode when VBPA is driven below the voltage of VSS by the bias generator 112. In particular, the control circuit 114 asserts ENN low to VSS to turn off NC1 while the bias generator 112 drives VBPA below VSS. If the ENN signal was provided directly to the gate of NC1, then the gate of NC1 would be at VSS whereas its drain would be below VSS potentially allowing NC1 to remain at least partially on. Instead, the LSN circuit 118 drives NEN to the voltage level of VBPA so that the gate and drain of NC1 are both at the voltage level of VBPA which is below VSS ensuring that NC 1 is turned fully off.

When it is desired to switch from the low power mode back to the normal operating mode, the control circuit 114 controls the bias generator 112 to drive VBNA back down to VDD and to drive VBPA back up to VSS. Then the control circuit 114 pulls ENP low and ENN high to turn on the clamp devices PC1 and NC1.

Figure 2:
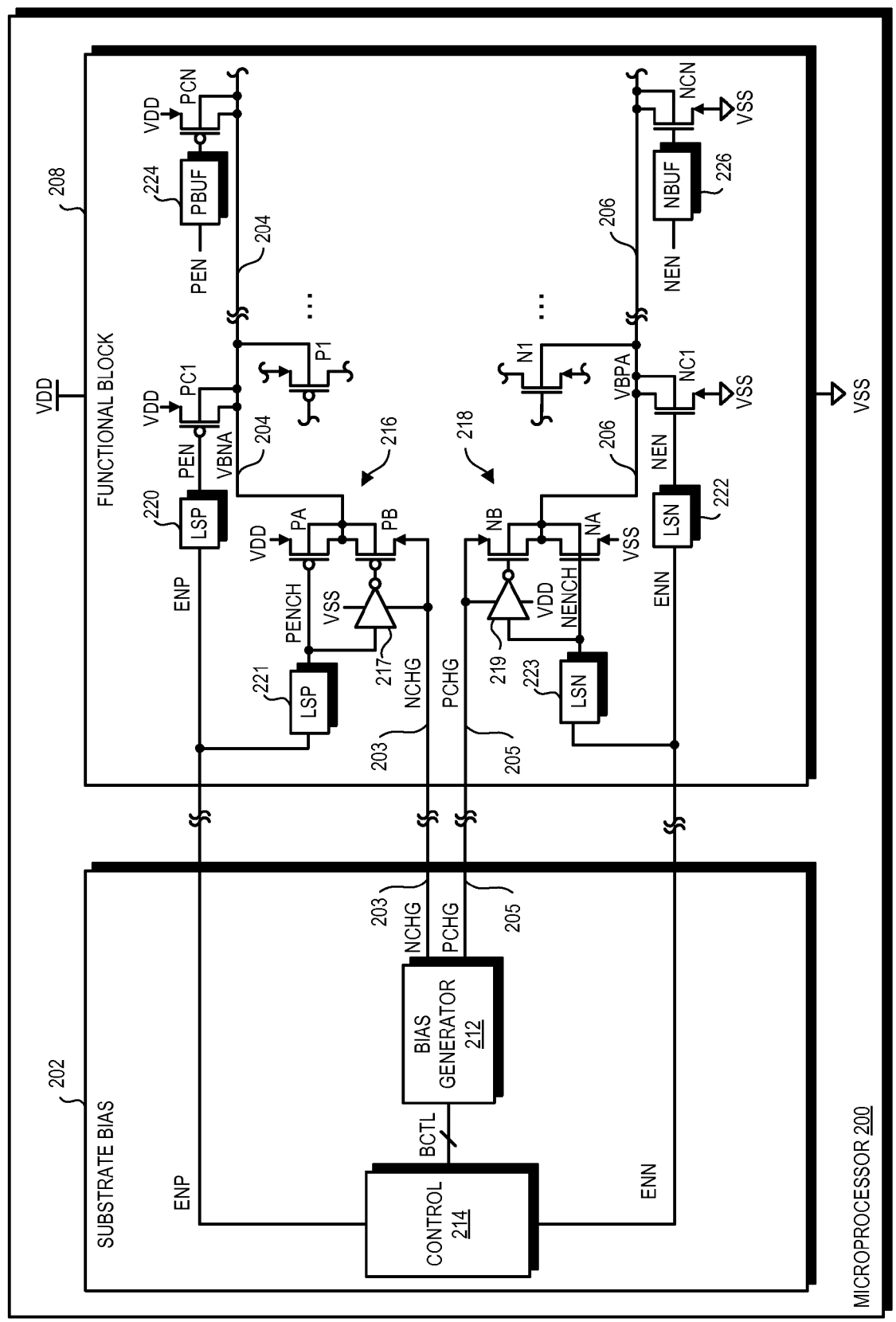
FIG. 2 is a schematic and block diagram of a substrate bias circuit implemented according to an exemplary embodiment and integrated onto the die of a microprocessor for minimizing sub-threshold leakage within a functional block on the microprocessor.

FIG. 2 is a schematic and block diagram of a substrate bias circuit 202 implemented according to an exemplary embodiment and integrated onto the die of a microprocessor 200 for minimizing sub-threshold leakage within a functional block 208 on the microprocessor 200. The substrate bias circuit 202 is similar to the substrate bias circuit 102 including similar devices and components that operate in a similar manner. The bias generator 112 is replaced by a similar bias generator 212 having outputs providing charged voltage levels NCHG and PCHG along conductive signal lines 203 and 205, respectively. The conductive signal lines 203 and 205 from the substrate bias circuit 202 are routed to the functional block 208 on the microprocessor 200. The NCHG and PCHG voltages are selectively used to drive the substrate bias voltages VBNA and VBPA on substrate bias rails 204 and 206, respectively, when the functional block 208 is in low power mode as further described below. The substrate bias rails 204 and 206 are routed within the functional block 208 to deliver the substrate bias voltages VBNA and VBPA to selected P-channel and N-channel devices integrated on the microprocessor 200 within the functional block 208. An exemplary P-channel device P1 is shown within the functional block 208 having a bulk connection coupled to the substrate bias rail 204 in a similar manner as the P-channel device 111. Similarly, an exemplary N-channel device N1 is shown within the functional block 208 having a bulk connection coupled to the substrate bias rail 206 in a similar manner as the N-channel device 113. Although only one P-channel device P1 and only one N-channel device N1 are shown, it is understood that any number of such devices are distributed within the functional block 208 with corresponding bulk connections to the applicable one of the substrate bias rails 204 and 206 in similar manner (as indicated by ellipses).

The control circuit 114 is replaced with a similar control circuit 214 which provides similar clamp enable signals ENP and ENN and similar control signals BCTL in a similar manner as previously described for the control circuit 114 of the IC 100. The ENP and ENN clamp enable signals are conveyed on corresponding conductive signal lines from the substrate bias circuit 202 to the functional block 208. The BCTL signals are provided to control the bias generator 212. Since the NCHG and PCHG voltages are ultimately used to drive the substrate bias voltages VBNA and VBPA, the bias generator develops the NCHG and PCHG voltages in a similar manner as previously described for the bias generator 112 developing the substrate bias voltages VBNA and VBPA for the IC 100.

In a similar manner as described above for the IC 100, the microprocessor 200 has multiple operating states or modes, including one or more low power modes or states in which at least a portion of the microprocessor 200 is selectively placed in a low power condition or otherwise turned off. In the illustrated embodiment, the functional block 208 is either turned fully on or selectively placed into low power mode by the control circuit 214 or by other control circuitry (not shown). When the functional block 208 is fully powered on, the control circuit 214 turns off the bias generator 212 or places it in a low power state, or otherwise controls the bias generator 212 to drive the NCHG and PCHG voltages to the same voltage levels as VDD and VSS, respectively. The control circuit 214 asserts the ENP signal low to turn on P-channel clamp devices of the functional block 208 to clamp the substrate bias rail 204 to VDD during full power mode of the functional block 208. Also, the control circuit 214 asserts the ENN signal high to turn on N-channel clamp devices of the functional block 208 to clamp the substrate bias rail 206 to VSS during full power mode. When the functional block 208 is placed in low power mode, the control circuit 214 controls or otherwise turns on the bias generator 212 to drive NCHG above the voltage of VDD and to drive PCHG below the voltage of VSS. The control circuit 214 asserts the ENP signal high to turn off the P-channel clamp devices and to drive the substrate bias voltage VBNA on the substrate bias rail 204 to the voltage level of NCHG. Also, the control circuit 214 asserts the ENN signal low to turn off the N-channel clamp devices and to drive the substrate bias voltage VBPA on the substrate bias rail 206 to the voltage level of PCHG.

The functional block 208 includes a P-channel select circuit 216 and an N-channel select circuit 218 for selectively driving the substrate bias rails 204 and 206 to the voltage levels of the NCHG and PCHG voltages as controlled by the clamp enable signals ENP and ENN, respectively. The select circuit 216 includes a P-type level shift (LSP) circuit 221 having an input receiving the ENP signal and an output providing an enable signal PENCH to the gate of a P-channel clamp device PA and to the input of an inverter 217. PA has its source coupled to VDD and its drain and substrate coupled to the substrate bias rail 204. The output of the inverter 217 is coupled to the gate of another P-channel device PB having its source receiving the NCHG voltage and its drain and substrate coupled to the substrate bias rail 204. As shown, the inverter 217 has its power rails coupled between VSS and NCHG and thus switches its output between the voltage levels of VSS and NCHG. The select circuit 218 includes an N-type level shift (LSN) circuit 223 having an input receiving the ENN signal and an output providing an enable signal NENCH to the gate of an N-channel device NA and to the input of an inverter 219. NA has its source coupled to VSS and its drain and substrate coupled to the substrate bias rail 206. The output of the inverter 219 is coupled to the gate of another N-channel device NB having its source receiving the PCHG voltage and its drain and substrate coupled to the substrate bias rail 206. As shown, the inverter 219 has its power rails coupled between VDD and PCHG and thus switches its output between the voltage levels of VDD and PCHG.

The select circuit 216 either clamps VBNA to VDD via PA or otherwise drives the voltage of VBNA to the voltage of NCHG via the device PB depending upon the ENP signal. The LSP circuit 221 operates in substantially similar manner as the LSP circuit 116 except relative to the voltage level of NCHG rather than the voltage level of VBNA. When ENP is asserted low to VSS during full power mode of the functional block 208, the LSP circuit 221 asserts PENCH low to VSS turning PA on which clamps VBNA to VDD. The inverter 217 asserts its output high to NCHG pulling the gate of PB high turning it off. When ENP is asserted high to VDD for low power mode, the LSP circuit 221 asserts PENCH high to NCHG turning PA off and the inverter 217 asserts its output low to VSS turning PB on. When PB is turned on, the voltage VBNA on the substrate bias rail 204 is asserted to the voltage of NCHG from the bias generator 212. In a similar manner, the select circuit 218 either clamps VBPA to VSS via NA or otherwise drives the voltage of VBPA to the voltage of PCHG via the device NB depending upon the ENN signal. The LSN circuit 223 operates in substantially similar manner as the LSN circuit 118 except relative to the voltage level of PCHG rather than the voltage level of VBPA. When ENN is asserted high to VDD during full power mode of the functional block 208, the LSN circuit 223 asserts NENCH high to VDD turning NA on which clamps VBPA to VSS. The inverter 219 asserts its output low to PCHG pulling the gate of NB low turning it off. When ENN is asserted low to VSS for low power mode, the LSN circuit 223 asserts NENCH low to PCHG turning NA off and the inverter 219 asserts its output high to VDD turning NB on. When NB is turned on, the voltage VBPA on the substrate bias rail 206 is asserted to the voltage of PCHG from the bias generator 212.

The clamp devices PA and NA serve to clamp the voltage of VBNA and VBPA on the substrate bias rails 204 and 206, respectively, to the voltage levels of VDD and VSS, respectively, during the full power mode of the functional block 208.

The functional block 208 may include additional P-channel and N-channel clamp devices. As shown, the functional block 208 includes a P-channel clamp device PC1 coupled to the substrate bias rail 204 and an N-channel clamp device NC1 coupled to the substrate bias rail 206. The source of PC1 is coupled to VDD and its drain and bulk are coupled together and to the substrate bias rail 204. The source of NC1 is coupled to VSS and its drain and bulk are coupled together and to the substrate bias rail 206. The ENP signal is provided to a P-type level shift (LSP) circuit 220, which provides a corresponding drive signal PEN to the gate of PC1. The LSP circuit 220 operates in substantially the same manner as the LSP circuit 116 so that PEN is switched between VSS and VBNA while ENP is switched between VSS and VDD. The ENN signal is provided to the input of an N-type level shift (LSN) circuit 222, which provides a corresponding drive signal NEN to the gate of NC1. The LSN circuit 222 operates in substantially the same manner as the LSN circuit 118 so that NEN is switched between VBPA and VDD while ENN is switched between VSS and VDD. In the full power mode of the functional block 208, ENP is asserted low to VSS so that PEN is also asserted low to VSS to turn on PC1 to further clamp the substrate bias rail 204 to VDD. Similarly, ENN is asserted high to VDD so that NEN is also asserted high to VDD to turn NC1 on to further clamp the substrate bias rail 206 to VSS. In the low power mode of the functional block 208 when VBNA is asserted above VDD to the voltage of NCHG, ENP is asserted high to VDD so that PEN is asserted high to the voltage level of VBNA to keep PC1 turned fully off. Similarly, in the low power mode when VBPA is asserted below VSS to the voltage of PCHG, ENN is asserted low to VSS so that NEN is asserted low to the voltage level of VBPA to keep NC1 turned fully off.

In one embodiment, the functional block 208 is relatively small and the clamp devices PA and NA are sufficiently large to adequately clamp the substrate bias rails 204 and 206 to VDD and VSS, respectively, during full power mode of the functional block 208. For example, the clamp devices PA and NA may be sufficient by themselves to ensure that the voltages along the substrate bias rails 204 and 206 do not vary from the nominal levels of the core voltages by a predetermined offset voltage level. In another embodiment, such as for a larger functional block 208 or when a larger number of P- and N-channel devices are coupled to the substrate bias rails, at least one additional clamp device is coupled to each of the substrate bias rails 204 and 206 within the functional block 208. As shown, for example, the additional clamp devices PC1 and NC1 may be sufficient for the particular configuration. In various embodiments, any number of additional clamp devices may be provided within the functional block 208 to ensure that the substrate bias rail 204 is adequately clamped to VDD and to ensure that the substrate bias rail 206 is adequately clamped to VSS to minimize voltage variations. As shown, for example, another P-channel clamp device PCN is included within the functional block 208 and coupled to the substrate bias rail 204. In a similar manner as previously described, the drain and bulk of PCN are coupled to the substrate bias rail 204 and its source is coupled to VDD. PCN represents any number of additional P-channel clamp devices for clamping the substrate bias rail 204 to VDD. Also, another N-channel clamp device NCN is included within the functional block 208 and coupled to the substrate bias rail 206. In a similar manner as previously described, the drain and bulk of NCN are coupled to the substrate bias rail 206 and its source is coupled to VSS. NCN represents any number of additional N-channel clamp devices for clamping the substrate bias rail 206 to VSS.

Since the clamp devices PCN and NCN are coupled to the substrate bias rails 204 and 206, respectively, it is desired that they be driven with the level-shifted signals PEN and NEN, respectively to ensure that they are turned fully off during normal operating mode. If the PEN and NEN signals do not provide sufficient power to drive additional clamp devices, then voltage shifted buffer circuits are used. In the illustrated embodiment, PEN is provided to the input of a P-type buffer (PBUF) circuit 224, having its output driving the gate of clamp device PCN, and NEN is provided to the input of an N-type buffer (NBUF) circuit 226, having its output driving the gate of clamp device NCN. It is appreciated that any number of buffer circuits and clamp devices may be included as desired to minimize voltage variations along the substrate bias rails 204 and 206 in various embodiments.

When the functional block 208 is placed into a low power mode, the control circuit 214 activates or otherwise controls the bias generator 212 to drive the voltage of NCHG above the voltage of VDD by the first substrate bias offset voltage and to drive the voltage of PCHG below the voltage of VSS by a second substrate bias offset voltage. The first and second substrate bias offset voltages may be the same or different voltage levels. The control circuit 214 further asserts the ENP signal high and the ENN signal low so that the NCHG voltage is asserted as the VBNA voltage on the substrate bias rail 204 and so that the PCHG voltage is asserted as the VBPA voltage on the substrate bias rail 206. In this manner, the bulk of P1 and other P-channel devices and the bulk of N1 and other N-channel devices of the functional block 208 are biased during low power mode to reduce or otherwise minimize sub-threshold leakage within the functional block 208 while it is placed on low power mode. The clamp devices PA and NA and any additional clamp devices within the functional block 208 (e.g., PC1, PCN, NC1, NCN) are turned off.

In order to bring the functional block 208 back to the normal operating mode from the low power mode, the control circuit 214 first controls the bias generator 212 to drive the NCHG/VBNA and PCHG/VBPA voltages on the substrate bias rails 204 and 206 back to the voltage levels of VDD and VSS, respectively. Then, the control circuit 214 asserts ENP high and ENN low to turn on the clamp devices and to decouple the substrate bias rails 204 and 206 from the NCHG and PCHG voltages, respectively. In various embodiments the control circuit 214 may further turn off the bias generator 212 or otherwise place it in a low power or standby mode to conserve power during normal operation of the functional block 208.

In one embodiment, it is desired that the substrate bias rails 204 and 206 do not vary from the nominal levels of the core voltages by a predetermined minimum voltage level when the clamp devices are activated. In a more particular embodiment, the predetermined minimum voltage level is approximately 10 millivolts (mV). If the clamp devices PA and NA are not sufficient to maintain voltage variations within the predetermined minimum voltage level, then additional clamp devices are distributed along the substrate bias rails (e.g., PC1, PCN, NC1, NCN, etc.). In one embodiment, the number and particular locations of the clamp devices along the substrate rails 204 and 206 are determined based on dynamic simulations or the like to maintain voltage and any noise level within predetermined minimum levels to achieve optimal performance of the microprocessor 200.

The functional block 208 represents any size or type of function unit within the microprocessor 200 in which it is desired to selectively power down the unit or block for any reason, such as to conserve power or reduce heat or the like. For example, the functional block 208 may represent a data unit or data cache, an integer unit, a floating point unit (FPU), etc. When the functional block 208 is powered down, the substrate bias rails 204 and 206 are charged to offset voltages relative to the nominal core voltage levels (e.g., VDD, VSS) to bias the substrates of P— and N-type devices within the functional block 208 to reduce sub-threshold leakage. When the functional block 208 is fully operational, the clamp devices clamp the substrate bias rails 204 and 206 to the nominal core voltage levels to minimize voltage variations and noise and thus to improve circuit operation and performance.

Figure 3:
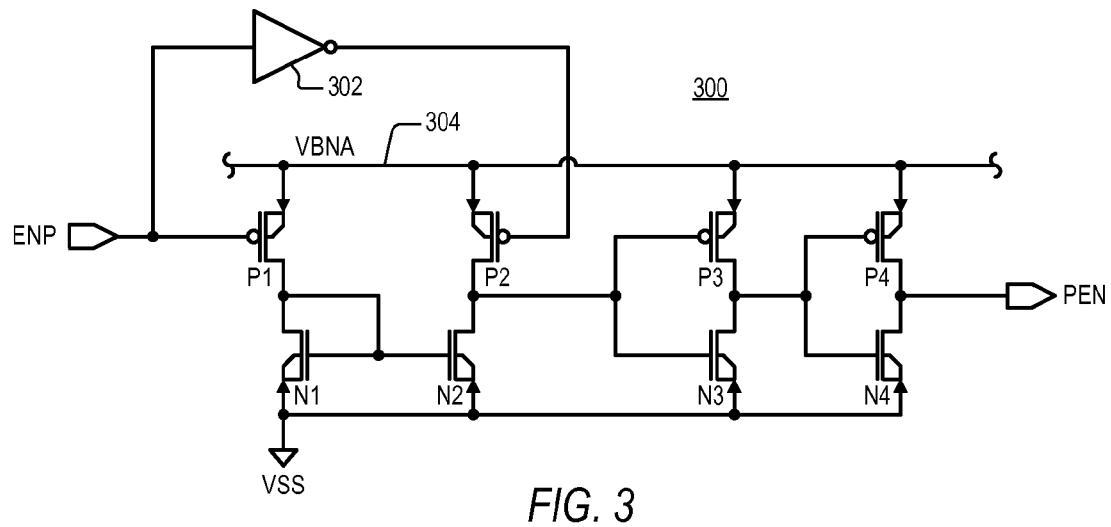
FIG. 3 is a schematic diagram of an LSP circuit implemented according to an exemplary embodiment which may be used as the LSP circuits of FIGS. 1 and 2.

FIG. 3 is a schematic diagram of an LSP circuit 300 implemented according to an exemplary embodiment which may be used as the LSP circuits 116 and 220. The LSP circuit 300 includes an inverter 302, four P-channel devices P1, P2, P3 and P4 and four N-channel devices N1, N2, N3 and N4. Each of the P-channel devices P1-P4 has its source and substrate (internal) coupled to a substrate bias rail 304 representing a substrate bias rail providing the VBNA voltage (e.g., 104 or 204) and each of the N-channel devices N1-N4 has its source and substrate (internal) coupled to VSS. The ENP signal is provided to the gate of P1 and to the input of the inverter 302. The drain of P1 is coupled to the drain and gate of N1 and to the gate of N2. The output of the inverter 302 is coupled to the gate of P2, which has its drain coupled to the drain of N2 and to the gates of P3 and N3. The drain of P3 is coupled to the drain of N3 and to the gates of P4 and N4. The drains of P4 and N4 are coupled together and develop the output PEN signal. In operation, the input ENP signal is asserted between the core voltages VSS and VDD whereas the output PEN signal is asserted between VSS and the substrate bias voltage VBNA. When ENP is asserted low to VSS, P1 is turned on and P2 is turned off (as output of the inverter 302 goes to VDD). P1 pulls the gate of N2 up towards VBNA so that N2 is turned on. N2 pulls the gates of P3 and N3 low to VSS turning P3 on and N3 off. P3 pulls the gates of P4 and N4 high towards VBNA turning N4 on and P4 off. Thus, when ENP is asserted low to VSS, PEN is pulled low to VSS via N4. When ENP is asserted high towards VDD, P1 is turned off and P2 is turned on. Since P1 is off, N1 pulls the gate of N2 low so that N2 is turned off. P2 pulls the gates of P3 and N3 high towards VBNA turning P3 off and N3 on. N3 pulls the gates of P4 and N4 low towards VSS turning P4 on and N4 off. Thus, when ENP is asserted high towards VDD, P4 pulls the PEN signal high towards VBNA. In this manner, ENP switches between VSS and VDD whereas PEN switches between VSS and VBNA.

Figure 4:
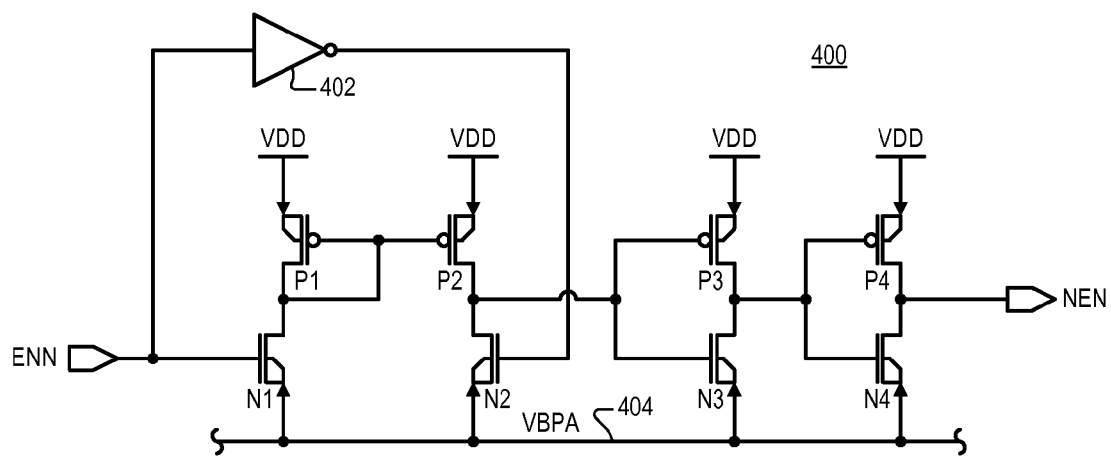
FIG. 4 is a schematic diagram of an LSN circuit implemented according to an exemplary embodiment which may be used as the LSN circuits of FIGS. 1 and 2.

FIG. 4 is a schematic diagram of an LSN circuit 400 implemented according to an exemplary embodiment which may be used as the LSN circuits 118 and 222. The LSN circuit 400 includes an inverter 402, four P-channel devices P1, P2, P3 and P4 and four N-channel devices N1, N2, N3 and N4. Each of the P-channel devices P1-P4 has its source and substrate (internal) coupled to VDD and each of the N-channel devices N1-N4 has its source and substrate (internal) coupled to a rail 404, which represents a substrate bias rail providing the VBPA voltage (e.g., 106 or 206). The ENN signal is provided to the gate of N1 and to the input of the inverter 402. The drain and gate of P1 is coupled to the drain of N1 and to the gate of P2. The output of inverter 402 is coupled to the gate of N2 which has its drain coupled to the drain of P2 and to the gates of P3 and N3. The drain of P3 is coupled to the drain of N3 and to the gates of P4 and N4. The drains of P4 and N4 are coupled together and develop the output NEN signal. In operation, the input ENN signal is asserted between the core voltages VSS and VDD whereas the output NEN signal is asserted between the substrate bias voltage VBPA and VDD. When ENN is asserted high towards VDD, N1 is turned on and N2 is turned off (as output of inverter 402 goes towards VSS). N1 pulls the gate of P2 low towards VBPA so that P2 is turned on. P2 pulls the gates of P3 and N3 high towards VDD turning P3 off and N3 on. N3 pulls the gates of P4 and N4 low towards VBPA turning N4 off and P4 on. Thus, when ENN is asserted high towards VDD, NEN is pulled high towards VDD via P4. When ENN is asserted low towards VSS, N1 is turned off and N2 is turned on. Since N1 is off, P1 pulls the gate of P2 high so that P2 is off. N2 pulls the gates of P3 and N3 low towards VBPA turning P3 on and N3 off. P3 pulls the gates of P4 and N4 high towards VDD turning P4 off and N4 on. Thus, when ENN is asserted low towards VSS, N4 pulls the NEN signal low towards VBPA. In this manner, ENN switches between VSS and VDD whereas NEN switches between VBPA and VDD.

Figure 5:
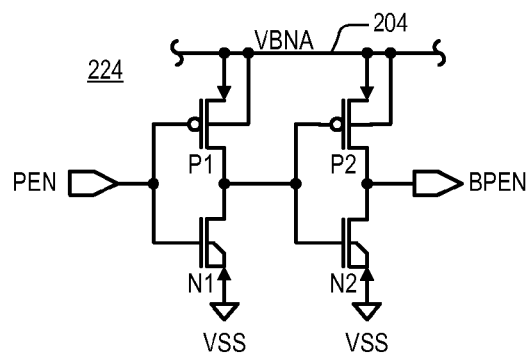
FIGS. 5 and 6 are schematic diagrams of P-type and N-type buffer circuits of FIG. 2 implemented according to an exemplary embodiment.

FIG. 5 is a schematic diagram of the PBUF circuit 224 implemented according to an exemplary embodiment. The PEN signal is provided to the gates of a P-channel device P1 and an N channel device N1. The source and substrate of P1 are coupled to the substrate bias rail 204 (providing VBNA) and the drain of P1 is coupled to the drain of N1. The drains of P1 and N1 are coupled to the gates of a P-channel device P2 and an N-channel device N2. The source and substrate of P2 are coupled to the substrate bias rail 204 and the drain of P2 is coupled to the drain of N2. The sources of N1 and N2 are coupled to VSS and the drains of P2 and N2 develop the BPEN signal. N1 and N2 both have their substrates (internal) coupled to VSS. In operation, when PEN is pulled low to VSS, P1 and N2 are both turned on while P2 and N1 are turned off so that BPEN is likewise driven to VSS. When PEN is pulled high to VBNA, P1 and N2 are both turned off while P2 and N1 are both turned on so that BPEN is pulled high to VBNA. In this manner, BPEN assumes the same logic state as PEN and switches between the level shifted voltage range of VSS and VBNA.

Figure 6:
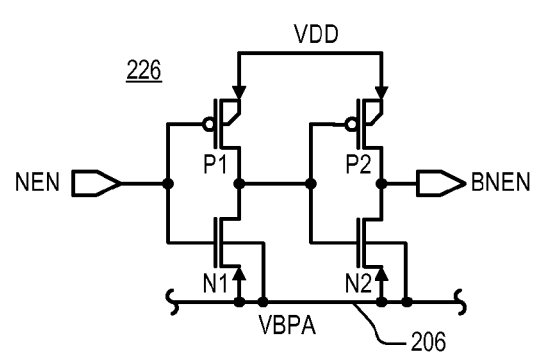

FIG. 6 is a schematic diagram of the NBUF circuit 226 implemented according to an exemplary embodiment. The NEN signal is provided to the gates of a P-channel device P1 and an N channel device N1. The source of P1 is coupled to VDD and the drain of P1 is coupled to the drain of N1. The source and substrate of N1 is coupled to the substrate bias rail 206 (providing VBPA). The drains of P1 and N1 are coupled to the gates of a P-channel device P2 and an N-channel device N2. The source of P2 is coupled to VDD and the drain of P2 is coupled to the drain of N2. The source and substrate of N2 are coupled to the substrate bias rail 206 and the drains of P2 and N2 develop the BNEN signal. P1 and P2 both have their substrates (internal) coupled to VDD. In operation, when NEN is pulled low to VBPA, P1 and N2 are both turned on while P2 and N1 are turned off so that BNEN is likewise driven to VBPA. When NEN is pulled high to VDD, P1 and N2 are both turned off while P2 and N1 are both turned on so that BNEN is pulled high to VDD. In this manner, BNEN assumes the same logic state as NEN and switches between the level shifted voltage range of VDD and VBPA.

Figure 7:
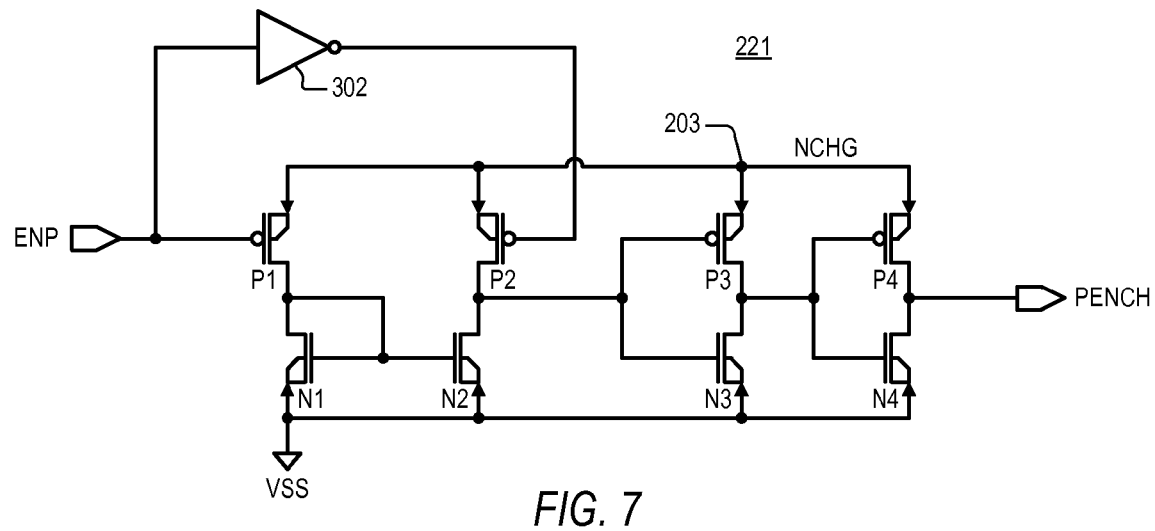
FIG. 7 is a schematic diagram of the LSP circuit of FIG. 2 implemented according to an exemplary embodiment.

FIG. 7 is a schematic diagram of the LSP circuit 221 implemented according to an exemplary embodiment. The LSP circuit 221 is substantially similar to the LSP circuit 300 except that coupling to the substrate bias rail 304 providing voltage VBNA is replaced with a coupling to the conductive signal line 203 providing the NCHG voltage. In this manner, ENP is asserted between VSS and VDD whereas PENCH is asserted between VSS and NCHG. Otherwise, operation is substantially identical.

Figure 8:
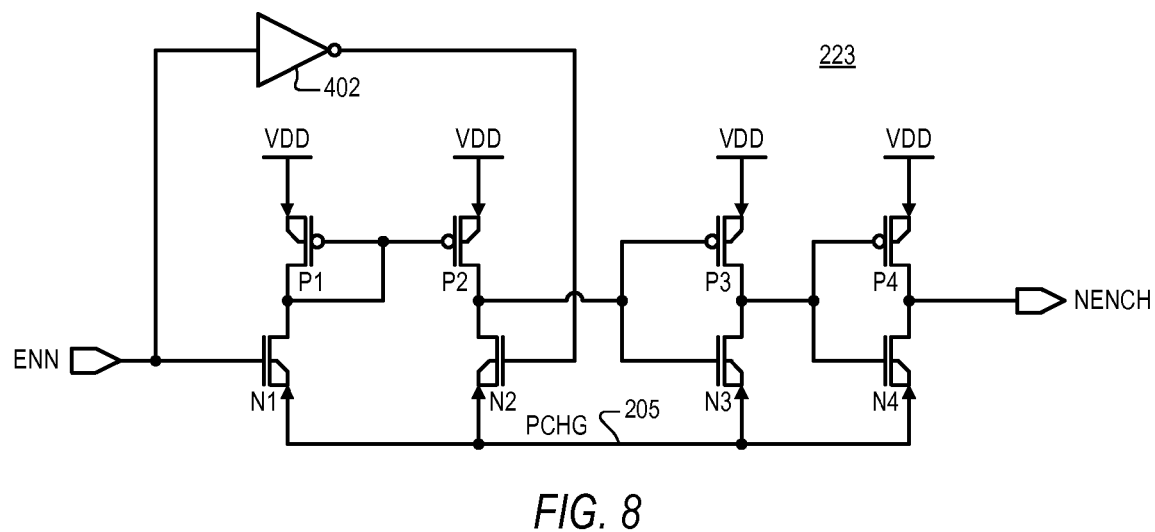
FIG. 8 is a schematic diagram of the LSN circuit of FIG. 2 implemented according to an exemplary embodiment.

FIG. 8 is a schematic diagram of the LSN circuit 223 implemented according to an exemplary embodiment. The LSN circuit 223 is substantially similar to the LSN circuit 400 except that coupling to the substrate bias rail 404 providing voltage VBPA is replaced with a coupling to the conductive signal line 205 providing the PCHG voltage. In this manner, ENN is asserted between VSS and VDD whereas NENCH is asserted between PCHG and VDD. Otherwise, operation is substantially identical.

Figure 9:
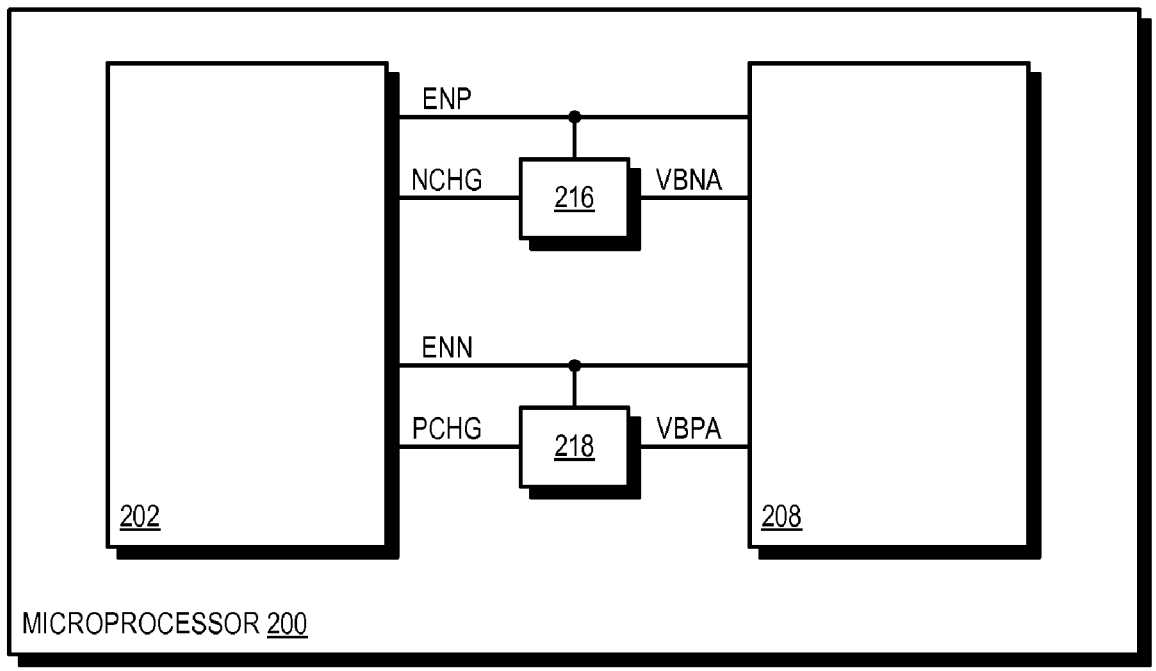
FIGS. 9 and 10 are block diagrams illustrating alternative embodiments of the microprocessor of FIG. 2.
Figure 10:
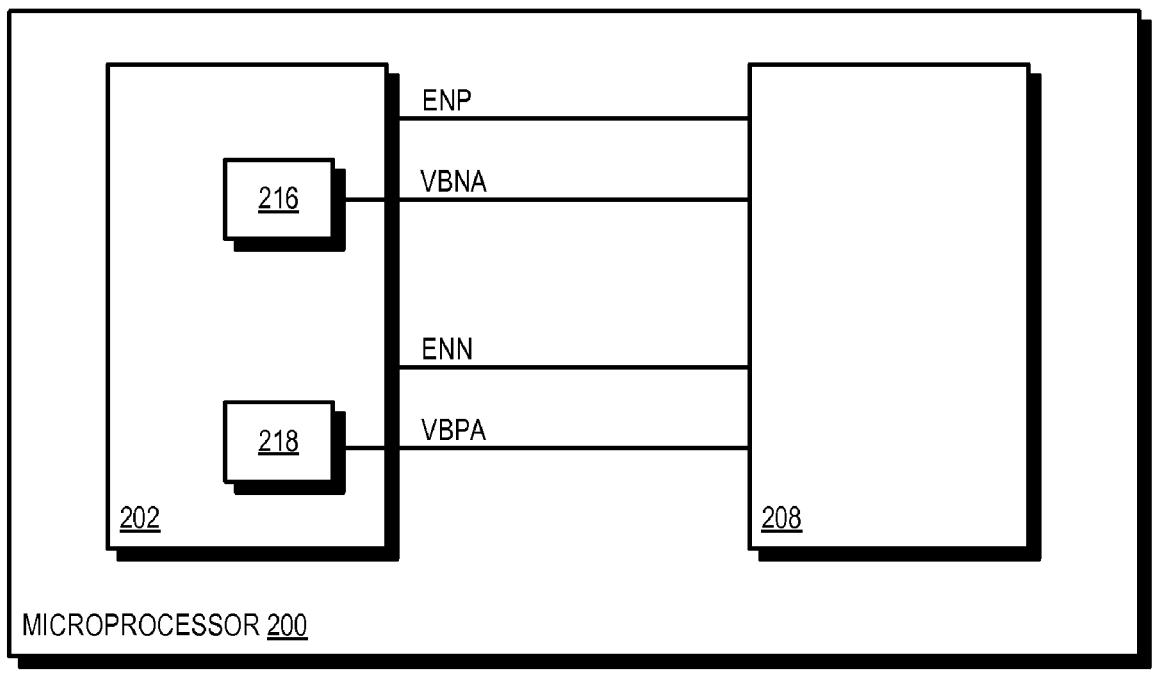

Many variations are possible and contemplated. FIG. 9, for example, is a block diagram illustrating an alternative embodiment of the microprocessor 200 of FIG. 2. The substrate bias circuit 202 and the functional block 208 are provided on the die of a microprocessor 200 in substantially similar manner, except that the select circuits 216 and 218 are external to the functional block 208. In this case, the NCHG and PCHG signals are routed on the corresponding conductive signal lines 203 and 205 to the select circuits 216 and 218, respectively, which provide the VBNA and VBPA signals on corresponding substrate bias rails 204 and 206, respectively, which are routed from the select circuits 216 and 218, respectively, to the functional block 208 as illustrated. Operation is substantially identical. FIG. 10 is a block diagram illustrating another alternative embodiment of the microprocessor 200 in which the select circuits 216 and 218 are instead provided within the substrate bias circuit 202. In this case, the VBNA and VBPA signals are provided on corresponding substrate bias rails 204 and 206 routed from the substrate bias circuit 202 to the functional block 208 as illustrated. Again, operation is substantially identical.

In a more specific configuration that may apply to any of the embodiments previously described, the core voltages are such that VSS is approximately 0 Volts (V) and VDD is approximately 1V. The bias generator drives an offset voltage up to 800 millivolts (mV) relative to the corresponding core voltage levels. In one embodiment, VBNA is charged up to approximately 1.8V when VDD is 1V and VBPA is pulled down to approximately −800 mV when VSS is 0V during the low power mode. It is understood that the actual core voltages may vary depending upon the operating mode of the device. For example, VDD may range between approximately 500 mV to 1.4V in certain configurations or under certain conditions. And further, the bias voltage offset for VBNA may be different from the bias voltage offset for VBPA. For example, alterative bias offset voltages are contemplated, such as 300 mV or 500 mV or the like. Furthermore, although the bias generator (112 or 212 or the like) is shown on chip, the bias generator or charge pump may be provided off chip for charging the substrate bias rails. If provided off-chip, operation is substantially the same except that the control circuit (114 or 214 or the like) may not provide the control signals BCTL or otherwise provides the control signals BCTL off-chip for external control. In any event, the VBNA and VBPA rails 104/204 and 106/206 are driven by a bias generator or charge pump or the like to respective voltage offsets relative to the normal core voltages.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is

1. A microprocessor, comprising:
   a first supply node providing a first core voltage;
   a functional block having a plurality of power modes, comprising:
      a plurality of semiconductor devices, each having a substrate connection; and
      a first substrate bias rail routed within said functional block and coupled to said substrate connection of at least one of said plurality of semiconductor devices;
   a first charge node;
   first select logic which couples said first substrate bias rail to said first charge node when said functional block is in a low power mode and which clamps said first substrate bias rail at a first location of said first substrate bias rail to said first supply node when said functional block is in a full power mode; and
   substrate bias logic which charges said first charge node to a first bias voltage at a first offset voltage relative to said first core voltage when said functional block is in said low power mode, wherein said substrate bias logic comprises a bias generator which charges said first charge node when said functional block is in said low power mode and which drives said first charge node to said first core voltage when said functional block transitions to said full power mode.

2. The microprocessor of claim 1, wherein said first select logic comprises:
   a first semiconductor device coupled between said first supply node and said first substrate bias rail;
   a second semiconductor device coupled between said first substrate bias rail and said first charge node; and
   wherein said first select logic activates said first semiconductor device in said full power mode and activates said second semiconductor device in said low power mode.

3. The microprocessor of claim 2, wherein:
   said substrate bias logic further comprises control logic providing a control signal having a first state for said full power mode and a second state for said low power mode of said functional block; and
   wherein said first select logic comprises a control input receiving said control signal, and wherein said first select logic activates said first semiconductor device when said control signal is in said first state and activates said second semiconductor device when said control signal is in said second state.

4. The microprocessor of claim 1, further comprising:
   a second supply node providing a second core voltage; and
   wherein said first select logic comprises:
      a control input receiving a control signal which switches between said first and second core voltages indicative of power mode of said functional block;
      level shift logic having an input receiving said control signal and an output providing a level-shifted control signal, wherein said level-shifted control signal switches between said first bias voltage and said second core voltage;
      an inverter having an input receiving said level-shifted control signal and an output, wherein said inverter output is switched between said first bias voltage and said second core voltage;
      a first semiconductor device comprising a gate receiving said level-shifted control signal, a source coupled to said first supply node and a drain and substrate coupled to said first substrate bias rail; and
      a second semiconductor device comprising a gate coupled to said output of said inverter, a source coupled to said first charge node and a drain and substrate coupled to said first substrate bias rail.

5. The microprocessor of claim 1, further comprising:
a first clamp device coupled between said first supply node and said first substrate bias rail and having a control input, wherein said first clamp device further clamps said first substrate bias rail at a second location of said first substrate bias rail to said first supply node when activated; and
level shift logic having an input receiving a control signal and an output coupled to said control input of said first clamp device, wherein said level shift logic drives its output to said first bias voltage to turn said first clamp device off when said functional block is in said low power mode.

6. The microprocessor of claim 5, further comprising:
a second clamp device coupled between said first supply node and said first substrate bias rail and having a control input, wherein said second clamp device clamps said first substrate bias rail at a third location of said first substrate bias rail to said first supply node when activated; and
buffer logic having an input coupled to said output of said level shift logic and an output coupled to said control input of said second clamp device;
wherein said buffer logic drives its output to follow said output of said level shift logic to turn said second clamp device off when said functional block is in said low power mode.

7. The microprocessor of claim 1, further comprising:
a second supply node providing a second core voltage;
wherein said functional block further comprises a second substrate bias rail routed within said functional block and coupled to said substrate connection of at least one of said plurality of semiconductor devices different from said at least one of said plurality of semiconductor devices coupled to said first substrate bias rail;
a second charge node;
second select logic which couples said second substrate bias rail to said second charge node when said functional block is in said low power mode and which clamps said second substrate bias rail to said second supply node when said functional block is in said full power mode; and
wherein said substrate bias logic charges said second charge node to a second bias voltage at a second offset voltage relative to said second core voltage when said functional block is in said low power mode.

8. The microprocessor of claim 7, wherein said bias generator charges said first charge node at a positive offset voltage added to said first core voltage in said low power mode of said functional block and charges said second charge node at a negative offset voltage added to said second core voltage in said low power mode of said functional block.

9. The microprocessor of claim 8, wherein:
said first select logic comprises:
 a first P-channel device having a drain and source coupled between said first supply node and said first substrate bias rail; and
 a second P-channel device having a drain and source coupled between said first charge node and said first substrate bias rail; and
wherein said second select logic comprises:
 a first N-channel device having a drain and source coupled between said second supply node and said second substrate bias rail; and
 a second N-channel device having a drain and source coupled between said second charge node and said second substrate bias rail.

10. The microprocessor of claim 9, wherein:
said substrate bias logic further comprises control logic which asserts a P-type control signal and an N-type control signal, wherein said P-type control signal and said N-type control signal are each switched between said first and second core voltages for indicating power mode of said functional block;
wherein said first select logic further comprises:
 P-type level shift logic having an input receiving said P-type control signal and an output providing a first level-shifted control signal which is switched between said second core voltage and said first bias voltage;
 a first inverter having an input receiving said first level-shifted control signal and having an output which switches between said second core voltage and said first bias voltage;
 wherein said first P-channel device has a substrate coupled to said first substrate bias rail and a gate receiving said first level-shifted control signal; and
 wherein said second P-channel device has a substrate coupled to said first substrate bias rail and a gate coupled to said output of said first inverter; and
wherein said second select logic further comprises:
 N-type level shift logic having an input receiving said N-type control signal and an output providing a second level-shifted control signal which is switched between said first core voltage and said second bias voltage;
 a second inverter having an input receiving said second level-shifted control signal and having an output which switches between said first core voltage and said second bias voltage;
 wherein said first N-channel device has a substrate coupled to said second substrate bias rail and a gate receiving said second level-shifted control signal; and
 wherein said second N-channel device has a substrate coupled to said second substrate bias rail and a gate coupled to said output of said second inverter.

11. The microprocessor of claim 1, wherein said first charge node and said first select logic are provided within said functional block.

12. An integrated circuit, comprising:
a substrate;
a functional block comprising a plurality of P-channel devices and a plurality of N-channel devices integrated onto said substrate, each of said plurality of P-channel and N-channel devices comprising a bulk connection, wherein said functional block has an active state and a low power state;
a first bias rail provided on said substrate within said functional block and coupled to said bulk connection of at least one of said plurality of P-channel devices;
a second bias rail provided on said substrate within said functional block and coupled to said bulk connection of at least one of said plurality of N-channel devices;
a first supply conductor provided on said substrate and providing a positive core voltage relative to a reference voltage provided by a second supply conductor provided on said substrate;
a substrate bias circuit provided on said substrate having a first output for charging said first bias rail and a second output for charging said second bias rail, wherein said substrate bias circuit charges said first bias rail to said positive core voltage and charges said second bias rail to said reference voltage when said functional block transitions from said low power state to said active state, and wherein said substrate bias circuit charges said first bias rail to a first bias voltage above said positive core voltage and charges said second bias rail to a second bias voltage below said reference voltage when said functional block is in said low power state, wherein said substrate bias circuit comprises a control circuit having first and second outputs each indicative of said active power state and said low power state; and a clamp circuit for clamping said first bias rail to said first supply conductor and for clamping said second bias rail to said second supply conductor during said active state, comprising:
  a first clamp device coupled between said first supply conductor and said first bias rail and having a control input;
  a second clamp device coupled between said second supply conductor and said second bias rail and having a control input;
  a first level shift circuit having an input coupled to said first output of said control circuit and an output coupled to said control input of said first clamp device, wherein said first level shift circuit switches its output between said reference voltage and said first bias voltage;
  a second level shift circuit having an input coupled to said second output of said control circuit and an output coupled to said control input of said second clamp device, wherein said second level shift circuit switches its output between said positive core voltage and said second bias voltage;
  a third clamp device coupled between said first supply conductor and said first bias rail and having a control input;
  a fourth clamp device coupled between said second supply conductor and said second bias rail and having a control input;
  a first buffer circuit having an input coupled to said output of said first level shift circuit and an output coupled to said control input of said third clamp device, wherein said first buffer circuit switches its output to follow said output of said first level shift circuit; and
  a second buffer circuit having an input coupled to said output of said second level shift circuit and an output coupled to said control input of said fourth clamp device, wherein said second buffer circuit switches its output to follow said output of said second level shift circuit.

13. The integrated circuit of claim 12, wherein said substrate bias circuit further comprises:
a first select circuit having a control input, said first select circuit comprising:
  a fifth clamp device coupled between said first supply conductor and said first bias rail;
  a first switch coupled between said first bias rail and said first output of said substrate bias circuit; and
  wherein said first select circuit selectively activates one of said fifth clamp device and said first switch based on said control input of said first select circuit;
a second select circuit having a control input, said second select circuit comprising:
  a sixth clamp device coupled between said second supply conductor and said second bias rail;
  a second switch coupled between said second bias rail and said second output of said substrate bias circuit; and
  wherein said second select circuit selectively activates one of said sixth clamp device and said second switch based on said control input of said second select circuit; and
wherein said first output of said control circuit is coupled to said control input of said first select circuit and a wherein said second output of said control circuit is coupled to said control input of said second select circuit, wherein said control circuit controls said first and second select circuits to clamp said first bias rail to said positive core voltage and to clamp said second bias rail to said reference voltage when said functional block is in said active state, and to drive said first bias rail to said first bias voltage and said second bias rail to said second bias voltage when said functional block is in said low power state.

14. The integrated circuit of claim 13, wherein:
said first select circuit further comprises:
  a P-type level shift circuit having an input coupled to said first output of said control circuit and an output providing a first level-shifted voltage between said reference voltage and said first bias voltage;
  a first inverter having an input receiving said first level-shifted voltage and an output which switches between said reference voltage and said first bias voltage;
  said fifth clamp device comprising a first P-channel device having a source coupled to said first supply conductor, a drain and substrate coupled to said first bias rail, and a gate receiving said first level-shifted voltage; and
  said first switch comprising a second P-channel device having a source coupled to said first output of said substrate bias circuit, a drain and substrate coupled to said first bias rail, and a gate coupled to said output of said first inverter; and
wherein said second select circuit further comprises:
  an N-type level shift circuit having an input coupled to said second output of said control circuit and an output providing a second level-shifted voltage between said positive core voltage and said second bias voltage;
  a second inverter having an input receiving said second level-shifted voltage and an output which switches between said positive core voltage and said second bias voltage;
  said sixth clamp device comprising a first N-channel device having a source coupled to said second supply conductor, a drain and substrate coupled to said second bias rail, and a gate receiving said second level-shifted voltage; and
  said second switch comprising a second N-channel device having a source coupled to said second output of said substrate bias circuit, a drain and substrate coupled to said second bias rail, and a gate coupled to said output of said second inverter.

15. A method of selectively biasing substrates of semiconductor devices of a functional block of a microprocessor chip which develops a first core voltage and which includes a substrate bias rail routed within the functional block used to reduce sub-threshold leakage of at least one of the semiconductor devices, said method comprising:
  clamping the substrate bias rail to the first core voltage when the functional block is in a first power state, wherein said clamping comprises activating a clamp device coupled between the substrate bias rail and the first core voltage;

wherein the clamp device comprises a semiconductor device having a gate, a drain and substrate coupled to the substrate bias rail, and a source coupled to the first core voltage, wherein said clamping comprises driving the gate of the semiconductor device to a second core voltage;

unclamping the substrate bias rail and driving the substrate bias rail to a substrate bias voltage when the functional block is in a second power state, wherein said unclamping comprises driving the gate of the semiconductor device to the substrate bias voltage; and wherein said driving the substrate bias rail comprises:

charging a charge node to an offset voltage relative to the first core voltage; and activating a second semiconductor device coupled between the substrate bias rail and the charge node to couple the substrate bias rail to the charge node.

16. The method of claim 15, further comprising:

level shifting an enable signal which switches between the first core voltage and the second core voltage to a level-shifted enable signal which switches between the substrate bias voltage and the second core voltage; and providing the level-shifted enable signal to the gate of the semiconductor device.

* * * * *